United States Patent [19]

Ohsawa

[11] 4,123,714
[45] Oct. 31, 1978

[54] FM RECEIVER WITH LIQUID CRYSTAL SIGNAL INDICATOR

[75] Inventor: Mitsuo Ohsawa, Fujisawa, Japan

[73] Assignee: Sony Corporation, Tokyo, Japan

[21] Appl. No.: 671,394

[22] Filed: Mar. 29, 1976

[30] Foreign Application Priority Data

Apr. 1, 1975 [JP] Japan .................................. 50-40148

[51] Int. Cl.² ............................................ H04H 5/00
[52] U.S. Cl. .............................. 325/455; 179/15 BT; 325/36
[58] Field of Search ............... 325/455, 36, 408, 398, 325/346; 179/15 BT, 1 G, 1 GQ; 350/160 LC

[56] References Cited

U.S. PATENT DOCUMENTS

| | | | |
|---|---|---|---|
| 2,819,400 | 1/1958 | Toth | 325/455 |
| 3,125,640 | 3/1964 | Recklinghausen | 325/455 |
| 3,272,923 | 9/1966 | Csicsatka | 179/15 BT |
| 3,297,825 | 1/1966 | Jacobson | 179/15 BT |
| 3,569,633 | 3/1971 | Brahman | 325/408 |
| 3,714,595 | 1/1973 | Denenberg et al. | 325/346 |
| 3,781,080 | 12/1973 | Aftergut | 350/160 LC |
| 3,792,199 | 2/1974 | Saedi | 325/36 |
| 3,882,490 | 5/1975 | Tashiro et al. | 350/160 LC |
| 3,896,386 | 7/1975 | Ohsawa | 325/455 |
| 3,944,749 | 3/1976 | Kahn | 325/36 |
| 3,999,132 | 12/1976 | Smith | 325/36 |

*Primary Examiner*—Robert L. Griffin
*Assistant Examiner*—Tommy P. Chin
*Attorney, Agent, or Firm*—Hill, Gross, Simpson, Van Santen, Steadman, Chiara & Simpson

[57] ABSTRACT

An FM receiver having a gate circuit extracting a pilot signal contained in a stereo composite signal and a circuit driving a liquid crystal display device with the output signal from the gate circuit, in which when there exists the pilot signal, "STEREO" is displayed on the liquid crystal display device, while when there exists no pilot signal "MONO" (monoral) is displayed on the same liquid crystal display device.

4 Claims, 6 Drawing Figures

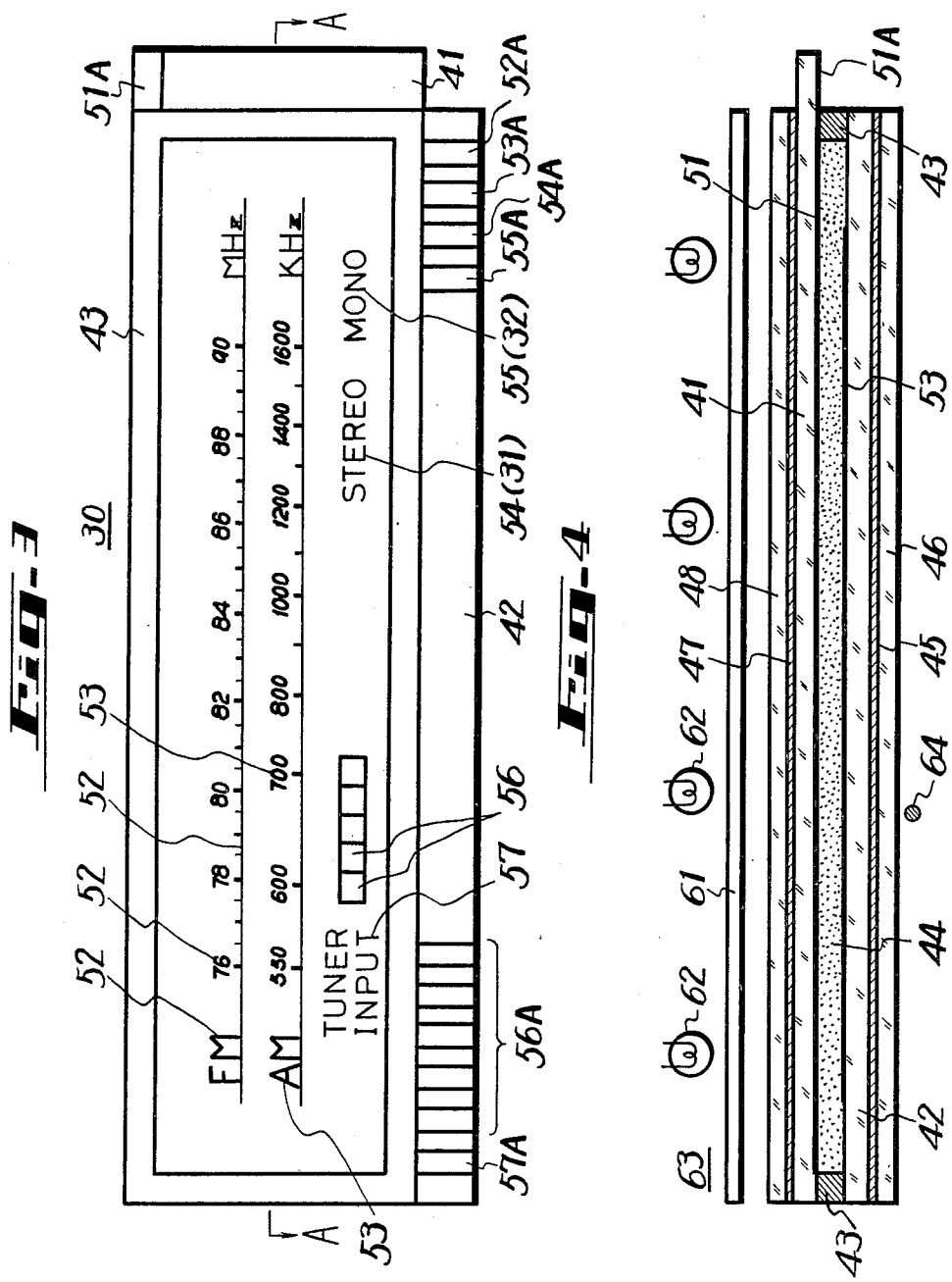

FM RECEIVER WITH LIQUID CRYSTAL SIGNAL INDICATOR

BACKGROUND OF THE INVENTION

1. Field of the Invention

The present invention relates generally to an FM receiver, and more particularly is directed to an FM receiver using a liquid crystal display device.

2. Description of the Prior Art

An ordinary IC (integrated circuit) is generally about 500 mW in power consumption in the prior art, and a CMOS-IC (complementary metal oxide semiconductor-integrated circuit) is much less in power consumption, for example, at most about 1 mW. Accordingly, the CMOS-IC generates almost no heat, so that it is free from secular variation and deterioration in characteristics. Further, the CMOS-IC has no bad influence on other circuit elements by heat generation, so that its reliability becomes high and also its power source circuit becomes simple since its power consumption is less.

For this reason, it has been considered in the art that an FM tuner formed of such a CMOS-IC utilizing its advantage may be used. When a CMOS-IC is used for forming an FM tuner, a gate circuit such as for muting can be formed easily. Therefore, the advantage caused by making an FM tuner of a CMOS-IC is great.

However, when the FM tuner is made of a CMOS-IC, the fact that the CMOS-IC consumes less power would mean that an output signal which is derived from the CMOS-IC is less and hence the output signal from the CMOS-IC itself would not be able to light a stereo display lamp. Therefore, with such a case it is necessary to provide a transistor between the CMOS-IC and the stereo display lamp for driving the lamp and in this case the transistor must be connected to the CMOS-IC from the outside thereof. This will reduce the effect of the FM tuner made of the CMOS-IC if the transistor is attached thereto from the outside thereof.

SUMMARY OF THE INVENTION

It is an object of the present invention to prvide an FM receiver made of a CMOS-IC in which a stereo display device can be driven directly with an output signal from the CMOS-IC.

It is another object of the invention to provide an FM receiver made of a CMOS-IC in which the above referred to problem caused upon driving the stereo display device is solved.

According to an aspect of the present invention, there is provided an FM receiver in which a liquid crystal display device is employed as a stereo display device and an alternating current signal in association with a stereo demodulation signal of 38 KHz is employed as a driving signal for the liquid crystal display device.

The other objects, features and advantages of the invention will become apparent from the following description taken in conjunction with the accompanying drawings.

BRIEF DESCRIPTION OF THE DRAWINGS

FIG. 3 is a front view of a dial scale plate shown in FIG. 1;

FIG. 4 is a cross-sectional view taken along the A—A line in FIG. 3; and

DESCRIPTION OF THE PREFERRED EMBODIMENT

An example of the FM receiver according to the present invention will be hereinbelow described with reference to the drawings.

Figure 1:
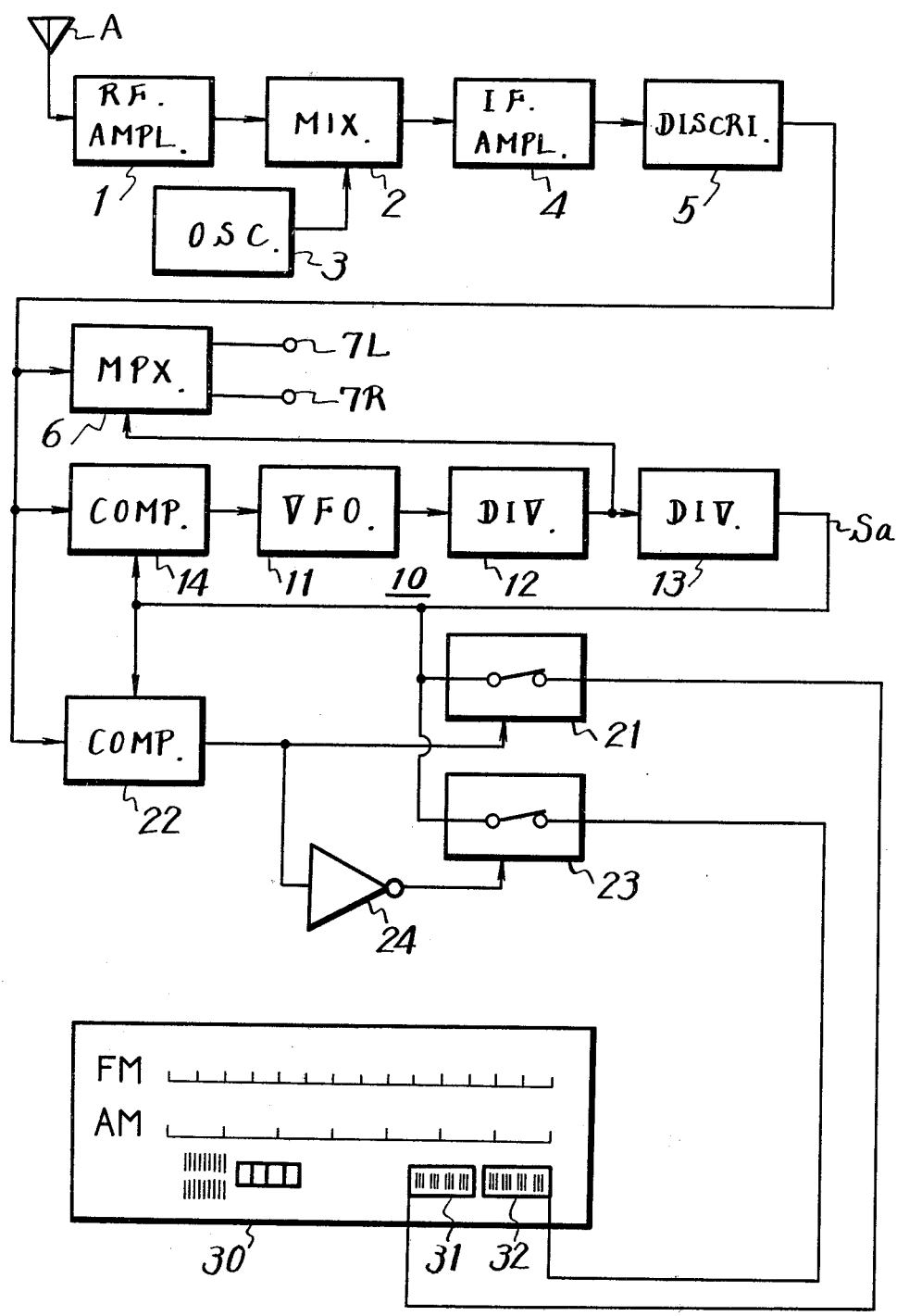
FIG. 1 is a systematic block diagram showing an embodiment of the FM receiver according to the present invention.

In FIG. 1 which shows schematically an example of the FM receiver according to the present invention. 1 designates an RF (radio frequency) signal amplifier, which will receive a broadcasting signal through an antenna A and amplify the same, 2 a mixer circuit connected to the output side of the RF amplifier 2, and 3 a local oscillator circuit which supplies its oscillation output signal to the mixer circuit 2. An IF (intermediate frequency) signal amplifier 4 is connected to the output side of the mixer circuit 2 and supplies its output signal to a discriminator circuit 5. This discriminator circuit 5 will produce a stereo composite signal when a stereo broadcasting signal is received, while a monoral or monaural signal when a monaural broadcasting signal is received. The output signals from the discriminator circuit 5 is supplied to a stereo discriminator or multiplex circuit 6 which will deliver stereo signals of the left and right channels to output terminals 7L and 7R, respectively, when the stereo broadcasting signal is received, while a monaural signal to the terminals 7L and 7R when the monaural broadcasting signal is received.

The output signal from the discriminator circuit 5 is also fed to a PLL (phase locked loop) 10 which will produce an alternating current signal for the stereo-demodulation upon the stereo signal reception. The PLL 10 is constructed such that a variable frequency oscillator 11 is provided, the oscillation output signal of, for example, self running frequency 76 KHz from which is fed to frequency divider circuit 12 to be frequency-divided into a signal with the frequency of 38 KHz, the output signal from the frequency divider circuit 12 is fed to another frequency divider circuit 13 to be frequency-divided into an alternating current signal Sa with the frequency of 19 KHz, and the signal Sa is supplied to a phase comparator circuit 14, which is also supplied with the output signal from the discriminator circuit 5 and supplies its output signal to the variable frequency oscillator circuit 11 as a control signal of the latter. Thus, upon the reception of the stereo signal the phase comparator 14 compares the phase of the signal Sa with that of the pilot signal contained in the stereo composite signal and produces the output signal to control the oscillation frequency of the oscillator 11 and hence to make the frequency and phase of the signal Sa in synchronism with the pilot signal. As a result, the alternating current signal with the frequency of 38 KHz from the frequency divider 12 is also synchronized with the pilot signal. The alternating current signal of 38 KHz from the frequency divider 12 is supplied to the stereo multiplex circuit 6 which then demodulates the left and right channel stereo signals from the stereo composite signal as described previously. Upon the reception of the monaural signal there exists no pilot signal, so that the oscillator 11 oscillates substantially at the self-running frequency of 76 KHz. Thus, the frequency of the alternating current signal Sa becomes about 19 KHz.

The stereo display circuit of this invention will be now described. The alternating current signal Sa from the frequency divider 13 is supplied to a gate circuit 21 and also to a phase comparator circuit 22 for detecting the pilot signal. The output signal from the discriminator 5 is supplied to the phase comparator circuit 22. The output signal from the phase comparator circuit 22 is supplied to the gate circuit 21 as a control signal, and the output signal from the gate circuit 21 is supplied to a stereo display member 31. In this case, the display member 31 is formed of a liquid crystal display device, but in the illustrated example all of a dial scale plate 30 is formed of a liquid crystal display device and one part of it is used as the stereo display member 31 (whose detail will be described later). The alternating current signal Sa from the frequency divider 13 is further supplied to a gate circuit 23 which is also supplied with the output signal from the phase comparator 22 through an inverter 24 as a control signal. The output signal from the gate circuit 23 is fed to a monaural display member 32 formed on the dial scale plate 30. In this case, the above mentioned circuit, especially at least frequency divider 13 and the gate circuits 21, 23 are formed as an integrated circuit of C-MOS type.

The gate circuits 21 and 23 shown in FIG. 1 will be now described further. The alternating current signal applied to a liquid crystal 44 is applied between two opposing electrodes, for example, electrodes 51 and 53 shown in FIG. 4. The liquid crystal 44 is made ON or OFF, depending upon whether the alternating current signal, which is applied across the electrodes 51 and 53 is the same in amplitude, is in phase or in reverse phase. This is done for decreasing the number of lead wires led out from the liquid crystal panel. The above gate circuits 21 and 23 serve in such a way that the alternating current signal therefrom applied to the electrode 53 is reverse in phase from that applied to the electrode 51. In the following description, the ON and OFF are described as switches.

Figure 2:
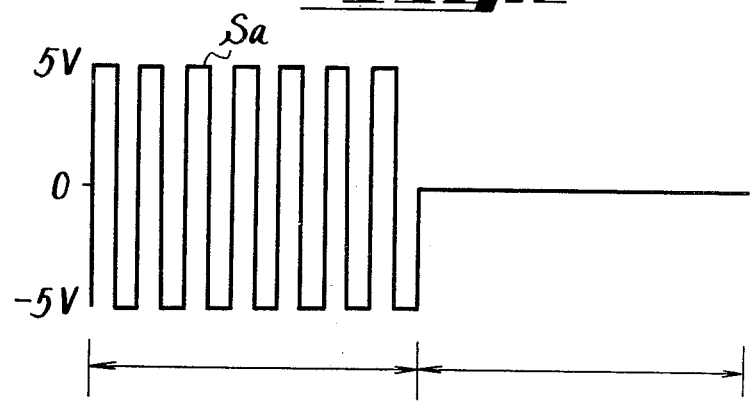
FIG. 2 is a waveform diagram used for explaining the embodiment shown in FIG. 1.

With a receiver constructed as above, upon the reception of a stereo signal the phase comparator circuit 22 compares the phase of the signal Sa with that of the pilot signal in the stereo composite signal and supplies its compared output signal to the gate circuit 21 to make the same ON. Thus, the stereo display member 31 is supplied from the gate circuit 21 with the alternating current signal Sa which is symmetrical in polarity as shown in FIG. 2, so that the molecule or crystal axis of the liquid crystal in the display member 31 is varied in direction by the electric field produced by the signal Sa and thereby the display indicia "STEREO" is carried out. In this case, the compared output signal from the phase comparator 22 is also supplied to the inverter 24 to be inverted and then to the gate circuit 23. Thus, this gate circuit 23 is made OFF and accordingly, the monaural display member 32 is supplied with the signal with 0-level. Thus, the display indicia "MONO" is not carried out on the display member 32.

While, upon the reception of a monaural signal since there exists no pilot signal, the phase comparator 22 produces no compared output signal. Thus, the gate circuit 21 is made OFF and accordingly, the stereo display member 31 is supplied with a signal of 0-level and the display the indicia of "STEREO" is not carried out. In this case, the gate circuit 23 is made ON by the inverted output signal from the inverter 24, so that the alternating current signal Sa from the frequency divider circuit 13 is supplied to the monaural display member 32 to display "MONO" thereon.

As described above, terms "STEREO" and "MONO" are displayed on the display members 31 and 32, respectively. In this case, however, the dislay members 31 and 32 are made as a liquid crystal display devive, so that their power consumptions are very small. Therefore, even if the above circuits are made as a CMOS-IC, the display members 31 and 32 can be driven directly and hence there is of no need of externally providing a transistor for driving the CMOS-IC. Thus, the circuit of the invention exhibits the advantage of forming the circuits as a CMOS-IC.

Further, with the invention, since the signal supplied to the display members 31 and 32 is the alternating current signal Sa, the display members 31 and 32 are not damaged. It is possible to supply a direct current signal to the display members 31 and 32 for making them display, but when the liquid crystal display device is supplied with the direct current signal, its liquid crystal will be damaged and its life will be greatly shortened. On the contrary, with the present invention, the alternating current signal Sa is supplied to the display members 31 and 32, so that the liquid crystal thereof is not damaged and hence will have a long life. In this case, since the alternating current signal Sa can be derived from the phase lock loop PLL 10 without providing an additional oscillator therefor, the circuit is simple in construction.

An example of the dial scale plate 30 made of the liquid crystal display device will be now described with reference to FIGS. 3 and 4. In general, the liquid crystal display device has two types, namely, a transparent type and reflection type, according to the manner of using an external light, and there are DSM type and FE type according to the manner of using a liquid crystal. In the following example, the liquid crystal display device belongs to the transparent type and a TN type in the FE type, and the dial belongs to a transverse type.

In FIGS. 3 and 4, 41 and 42 designate transparent glass base plates for electrodes which are formed to be, for example, rectangular in accordance with the shape of the dial. In the illustrated example, the glass base plate 41 is extended at its right end portion beyond that of the glass base plate 42, while the glass base plate 42 is extended at its lower end portion beyond that of the glass base plate 41. (See FIG. 3). The glass base plates 41 and 42 are separated by a spacer 43 therebetween except that the right end portion of the glass base plate 41 and the lower end portion of the glass base plate 42 and then they are bonded with adhesive agent. In this case, the spacer 43 is formed as a rectangular frame in accordance with the shape of the dial. Thus, an air-tight space is defined by the glass base plates 41 and 42 and the spacer 43, and a liquid crystal 44 of TN type is sealed up in the space.

A common transparent electrode 51 is formed on approximately the whole of the surface of the glass base electrode 41 which is in contact with the liquid crystal 44 by, for example, vacuum evaporation of indium oxide, tin oxide or the like, and a part of the electrode 51 is extended to the right end portion of the glass plate 41 to be a terminal 51A.

Further, on the surface of the glass base plate 42 which is in contact with the liquid crystal 44, there is formed a transparent electrode 52 which has patterns corresponding to the band display letters, frequency scales, frequency numerals and frequency unit letters for the FM bands, respectively, at positions, and also a transparent electrode 53 which has patterns for the AM bands similar to those of FM bands. Also, on a part of the surface of the glass base plate 42 which contacts with the liquid crystal 44, there is formed a transparent electrode 54 with a pattern of the stereo display letter as the stereo display member 31, a transparent electrode 55 with a pattern of the monoral display letters as the monoral display member 32, a transparent electrode 56 for the tuner input display consisting of, for example, adjacent five rectangular shape blocks, and a transparent electrode 57 with a pattern of the tuner input display letters near the electrode 56, respectively.

Figure 5A:
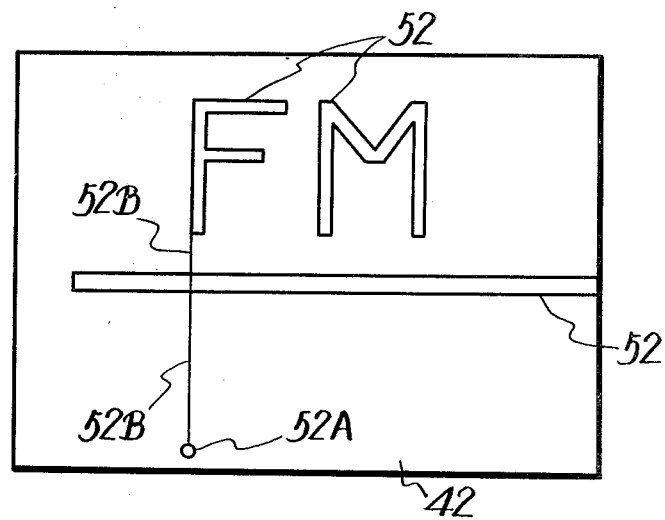
FIGS. 5A and 5B are front views showing in enlarged scale a part of the dial scale plate shown in FIGS. 3 and 4.
Figure 5B:
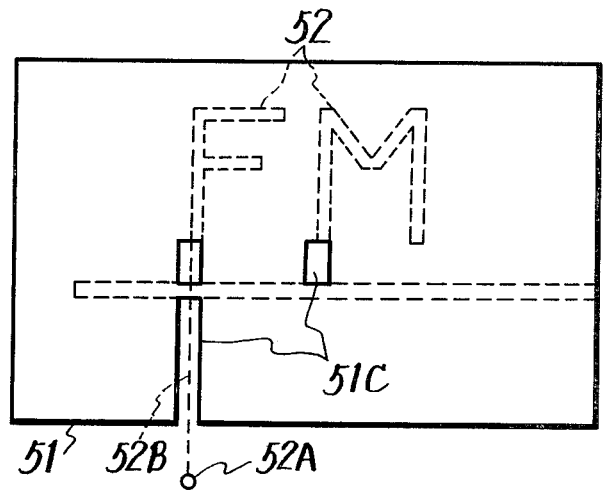

In this case, as shown in FIG. 5A, the respective parts of the transparent electrode 52 are connected with one another by transparent connecting wires 52B formed on the glass base plate 42 together with the transparent electrodes 52, and the connecting wire 52B is extended to the lower portion of the glass base plate 42 to be connected to the terminal 52A. Similarly, the parts of each of the transparent electrode 53 and 57 are connected with one another by transparent connecting wires (not shown) and terminals 53A to 57A are led out, respectively. In this case, the terminals 56A are led out from the respective blocks of the electrode 56. Further, in this case as shown in FIG. 5B, the parts of the electrode 51 which correspond to the connecting wire 52B and to those of the other electrodes 53 to 57 are made as bores or recesses 51C.

A polarizing film 45 and a protective glass plate 46 are mounted closely on the front surface of the glass base plate 42, while a polarizing film 47 and a protective glass plate 48 are mounted closely on the rear surface of the glass base plate 41. In this case, the polarizing axes of the respective polarizing films 45 and 47 are selected to be the same in direction. A plane light source 63 consisting of, for example, a semi-transparent plastic plate 61 and lamps 62 is provided in back of the protective glass plate 48, and a transverse travelling dial pointer 64 (shown in FIG. 4, but not shown in FIG. 3) is provided in front of the protective glass plate 46.

With the dial scale plate 30 of the invention constructed as above, when no voltage is applied between the terminals 52A to 57A and the terminal 51A, there is produced no electric field between the electrodes 52 to 57 and the electrode 51. Therefore, the crystal axis of the liquid crystal 44 is twisted by 90° from the glass base plate 41 to that of 42, while the polarizing axes of the polarizing films 47 and 45 are equal with each other. Accordingly, the light from the light source 63 can not pass through the polarizing film 45, and hence the dial scale plate 30 looks black and no display is seen when the dial scale plate 30 is viewed from the front.

However, when the alternating current signal Sa is applied across the terminals 54A and 51A, an electric field is generated by the alternating current signal Sa between the electrodes 54 and 51, and the crystal axis of the liquid crystal 44 is arranged by the field in the direction thereof to delete the twist of the crystal axis. Thus, the light from the light source 63 passes through the polarizing film 47, the liquid crystal 44 and the polarizing film 45 with the pattern of the electrode 54, so that when the dial scale plate 30 is viewed in front thereof, it emits the light with the pattern of the electrode 54 to display the word "STEREO". In this case, since the bores or recesses 51C are formed through the electrode 51 at the portions corresponding to the connecting wires 52B, no electric field is produced on the portion corresponding to the connecting wire 52B and hence the light from the light source 63 is prevented from being leaked to the front of the dial scale plate 30 at the part corresponding to the connection wire 52B.

Similarly, when the alternating current signal Sa is applied across the terminals 55A and 51A, the display of "MONO" is carried out by the electrode 55.

Further, when the FM signal is received by the operation of the input change-over switch and, for example, the alternating current signal Sa is applied across the terminals 52A and 51A, the letter, numerals and frequency value of the received FM signal are displayed by the electrode 52, respectively, while if the alternating current signal Sa is applied across the terminals 53A and 51A upon the reception of the AM signal, the letter, numerals and frequency value of the received AM signal are displayed by the electrode 53, respectively. The alternating current signal Sa is always applied across the terminals 57A and 51A to always display the letter by the electrode 57, and the alternating current signal Sa is applied across the respective ones of the terminal 56A and the terminal 51A, selectively, or increased or decreased manner one by one in response to the input level of the tuner to change the position or number of the blocks of the electrode 56 which may pass therethrough the light emitted from the light source 63 in response to the input level of the tuner.

Thus, the information necessary for the signal reception are displayed on the dial scale plate 30 by the liquid crystal. In this case, since the liquid crystal 44 is controlled by the electric field produced by the alternating current signal Sa, the liquid crystal 44 is not damaged any, and there is of no need to specially provide a signal source for the alternating current signal Sa.

In the illustrated and described example of the present invention, the alternating current signal Sa is applied to the display members 31, 32 or the other electrodes, but it may be possible that this alternating current signal Sa is further divided in frequency and applied to the same electrodes. It may be also possible that the alternating current signal Sa or a signal which is provided by further frequency-dividing the signal Sa is changed in its duty ratio by, for example, a monostable multivibrator and then applied to the electrodes. Further, the display method of a liquid crystal can be varied in accordance with the characteristics of the liquid crystal. It is, of course, possible that the electrodes 52 to 57 be connected commonly while the electrode 51 is divided in response to the electrodes 52 to 57 and terminals led out from the divided electrodes.

Further, it may be understood that this invention can be adapted to a 4-channel stereo receiver in which 4-channel stereo, 2-channel stereo and monoral are discriminated and then displayed.

It will be understood that many modifications and variations could be effected by one skilled in the art without departing from the spirit and scope of the novel concepts of the present invention.

I claim as my invention:

1. An FM receiver comprising:
 (a) means for receiving both stereo broadcast signals and monaural broadcast signals and for discrminating signals of a selected broadcast frequency channel;
 (b) means for detecting whether a pilot signal indicating the existence of a stereo signal is present in said discriminated signals of said selected broadcast frequency channel;

(c) a first phase comparator circuit to which the output signal of said discriminating means is fed;

(d) a second phase comparator circuit to which the output signal of said discriminating means is fed;

(e) one of said phase comparator circuits including means on its output side for inverting a signal passing therethrough;

(f) a phase-lock-loop which includes said first phase comparator, a variable frequency oscillator, a first frequency divider, and a second frequency divider;

(g) means for producing an AC signal in said phase-lock-loop;

(h) first and second gating circuits;

(i) means for feeding said AC signal to said first and second gating circuits, means for feeding the output of said second comparator circuit to said first gating circuit, and means for feeding the inverted output of said second comparator circuit to said second gating circuit;

(j) one of said gating circuits being in an ON state, and one being in an OFF state when a broadcast signal is being received; and (k) a liquid crystal display means connected to said gating circuits for displaying a stereo indicating sign when one of said gating circuits is ON and for displaying a monaural indicating sign when the other of said gating circuits is ON.

2. A FM stereo-monaural receiver for selectively receiving a monaural broadcast signal or a composite stereo signal, said stereo signal having left and right channels and having a pilot signal, comprising a radio frequency state, an intermediate frequency stage and a discriminator for producing a stereo composite signal when said pilot signal is received, a multiplex circuit having left and right output channels connected to the output of said discriminator, a phase-lock-loop circuit also connected to the output of said discriminator through a first phase comparator which produces an AC signal for stereo demodulation upon reception of a stereo signal, said phase-lock-loop circuit including said first phase comparator, a variable frequency oscillator connected to the output of said first phase comparator, a first frequency divider connected to the output of said oscillator for developing a first divided signal, and a second frequency divider connected to the output of said first frequency divider for developing a second divided signal, a second phase comparator also connected to the output of said discriminator, means for feeding said first divided signal to said multiplex circuit, means for feeding the output of said first phase comparator to said variable frequency oscillator as a control signal of the oscillator, means for connecting the output of said second frequency divider to said first and second phase comparators, first and second gate circuits, an inverter, means connecting the output of said first phase comparator to said first gating circuit, means connecting the output of said second phase comparator through said inverter to said second gating circuit, a first visual display means for indicating the presence of a stereo broadcast signal, a second visual display means for indicating the presence of a monaural broadcast signal, said first display means being connected to the output of said first gating circuit, and said second display means being connected to the output of said second gating circuit.

3. An FM stereo-monaural receiver for selectively receiving a monaural broadcast signal or a composite stereo signal, said stereo signal having left and right channels and having a pilot signal, comprising a radio frequency state, an intermediate frequency stage and a discriminator for producing a stereo composite signal when said pilot signal is received, a multiplex circuit having left and right output channels connected to the output of said discriminator, a phase-lock-loop circuit also connected to the output of said discriminator through a first phase comparator which produces an AC signal for stereo demodulation upon reception of a stereo signal, said phase-lock-loop circuit including said first phase comparator, a variable frequency oscillator connected to the output of said first comparator, a first frequency divider connected to the output of said oscillator for developing a first divided signal, and a second frequency divider connected to the output of said first frequency divider for developing a second divided signal, a second phase comparator also connected to the output of said discriminator, means for feeding said first divided signal to said multiplex circuit, means for feeding the output of said first phase comparator to said variable frequency oscillator as a control signal of the oscillator, means for connecting the output of said second frequency divider to said first and second phase comparators, first and second gate circuits, an inverter, means for connecting the output of said first phase comparator to said first gating circuit, means connecting the output of said second phase comparator through said inverter to said second gating circuit, a first visual display means for indicating the presence of a stereo broadcast signal, a second visual display means for indicating the presence of a monaural broadcast signal, said first display means being connected to the output of said first gating circuit, and said second display means being connected to the output of said second gating circuit, said first divided frequency in said phase-lock-loop being 38 KHz, and said second divided frequency being 19 KHz.

4. An FM stereo-monaural receiver for selectively receiving a monaural broadcast signal or a composite stereo signal, said stereo signal having left and right channels and having a pilot signal, comprising a radio frequency stage, an intermediate frequency stage and a discriminator for producing a stereo composite signal when said pilot is received, a multiplex circuit having left and right output channels connected to the output of said discriminator, a phase-lock-loop circuit also connected to the output of said discriminator through a first phase comparator which produces an Ac signal for stereo demodulation upon reception of a stereo signal, said phase-lock-loop circuit including said first phase comparator, a variable frequency oscillator connected to the output of said first phase comparator, a first frequency divider connected to the output of said oscillator for developing a first divided signal, and a second frequency divider connected to the output of said first frequency divider for developing a second divided signal, a second phase comparator also connected to the output of said discriminator, means for feeding said first divided signal to said multiplex circuit, and said second comparator, means for feeding the output of said first phase comparator to said variable frequency oscillator as a control signal of the oscillator, means for connecting the output of said second frequency divider to said first and second phase comparators, first and second gate circuits, an inverter, means for connecting the output of said first phase comparator to said first gating circuit, means connecting the output of said second phase comparator through said inverter to said second gating circuit, a first visual display means for indicating the presence of a stereo broadcast signal, a second visual display means for indicating the presence of a monaural broadcast signal, display said first display means being connected to the output of said first gating circuit, and said second display means being connected to the output of said second gating circuit, said first and second display means being liquid crystal display devices.

* * * * *